(12) United States Patent
Fujii et al.

(10) Patent No.: US 10,907,246 B2
(45) Date of Patent: Feb. 2, 2021

(54) FILM-FORMING APPARATUS, METHOD FOR PRODUCING FILM-FORMED PRODUCT USING SAME, AND COOLING PANEL

(71) Applicant: KOBE STEEL, LTD., Hyogo (JP)

(72) Inventors: Hirofumi Fujii, Takasago (JP); Takeshi Suzuki, Takasago (JP)

(73) Assignee: Kobe Steel, Ltd., Hyogo (JP)

( * ) Notice: Subject to any disclaimer, the term of this patent is extended or adjusted under 35 U.S.C. 154(b) by 95 days.

(21) Appl. No.: 16/467,174

(22) PCT Filed: Nov. 16, 2017

(86) PCT No.: PCT/JP2017/041326
§ 371 (c)(1),
(2) Date: Jun. 6, 2019

(87) PCT Pub. No.: WO2018/105354
PCT Pub. Date: Jun. 14, 2018

(65) Prior Publication Data
US 2019/0316248 A1  Oct. 17, 2019

(30) Foreign Application Priority Data
Dec. 7, 2016 (JP) ................ 2016-237628

(51) Int. Cl.
*C23C 14/34* (2006.01)
*C23C 14/32* (2006.01)
*H01J 37/34* (2006.01)

(52) U.S. Cl.
CPC ........ *C23C 14/3407* (2013.01); *C23C 14/325* (2013.01); *H01J 37/3435* (2013.01); *H01J 2237/002* (2013.01)

(58) Field of Classification Search
CPC ............ H01J 37/3435; H01J 2237/002; C23C 14/325; C23C 14/3407; C23C 14/541
USPC ....................... 204/298.09, 192.12
See application file for complete search history.

(56) References Cited

U.S. PATENT DOCUMENTS 5,753,092 A * 5/1998 Hollars ............... C23C 14/50
118/719
2007/0240982 A1  10/2007 Tamagaki et al.
2011/0067631 A1  3/2011 Tamagaki et al.

FOREIGN PATENT DOCUMENTS

CN   102439195 A   5/2012
JP   2006291308 A  10/2006

* cited by examiner

*Primary Examiner* — Rodney G McDonald
(74) *Attorney, Agent, or Firm* — Studebaker & Brackett PC

(57) ABSTRACT

A film-forming apparatus having a simple and downsized structure is provided. The film-forming apparatus includes at least one target having an opposing face that opposes a substrate, a plurality of target holders each detachably holding the target, a cooling unit that cools a plurality of the target holders, and at least one cooling panel. The at least one cooling panel includes a held part held by the target holder, and a heat receiving part having a heat receiving face that opposes the substrate with the held part held by the target holder and receives radiation heat emitted from the substrate. The held part transfers heat from the heat receiving face to the target holder. Each target holder selectively holds the target or the cooling panel.

9 Claims, 7 Drawing Sheets

FIG.1

FILM-FORMING APPARATUS, METHOD FOR PRODUCING FILM-FORMED PRODUCT USING SAME, AND COOLING PANEL

TECHNICAL FIELD

The present invention relates to a film-forming apparatus including a cooling panel.

BACKGROUND ART

A film-forming apparatus is known that forms a film on a surface of a substrate by spattering or arc discharging. Such a film-forming apparatus may cause the temperature of a target to become high by arc discharging or the like during a film-forming process, thereby resulting in melting of the target. Thus, the film-forming apparatus usually has a cooling means for cooling the target during forming of a film.

Meanwhile, the temperature of the substrate also gets high during film-forming. This is because the substrate receives heat energy from high energy particles of a film-forming material that comes out of the target and deposits on the surface of the substrate. As the temperature of the substrate gets high, hardness of the film formed on the surface of the substrate might be reduced depending on the type of the film-forming material (carbon, for example). The rise in the temperature of the substrate might also cause reduction in hardness of the substrate or strain in the substrate.

Conventionally, various types of film-forming apparatuses having a dedicated cooling means for cooling the substrate during the film-forming process have been proposed, the dedicated cooling means being provided separately from a cooling means for cooling the target.

For example, a film-forming apparatus disclosed in Patent Literature 1 includes a water-cooled type cooling panel provided inside a vacuum chamber. The cooling panel absorbs radiation heat emitted from the substrate inside the vacuum chamber during the film-forming process.

The cooling panel includes a heat transfer tube in which cooling water flows, and a pair of metal heat transfer plates which holds the heat transfer tube by both sides. A pair of the heat transfer tubes is connected to an external pump or the like via a communication tube penetrating a wall of the vacuum chamber. The cooling panel is cooled by cooling water continuously supplied from the outside of the vacuum chamber and thereby the substrate is cooled.

The film-forming apparatus described above however needs a dedicated cooling means for cooling the substrate besides the cooling means for cooling the target. That is, a plurality of different cooling means is necessary. This results in a film-forming apparatus having a complex and large structure. Moreover, the cooling panel cannot be detached easily from the vacuum chamber. This makes it very difficult to perform maintenance, for example, cleaning of the cooling panel.

CITATION LIST

Patent Literature

Patent Literature 1: JP 2006-291308 A1

SUMMARY OF INVENTION

An object of the present invention is to provide a film-forming apparatus having a simple and downsized structure and provided with an easily detachable cooling panel.

The inventors have focused on a target holder provided in a film-forming apparatus to detachably hold and cool a target. Specifically, the inventors have arrived at an idea of mounting a cooling panel, having a heat receiving face that receives radiation heat emitted from a substrate, on the target holder instead of the target. This idea enables the cooling panel receiving the radiation heat to be held using the target holder, and thereby the substrate can indirectly be cooled.

Specifically, provided is a film-forming apparatus including a film forming chamber, a substrate supporting part that supports the substrate inside the film forming chamber, at least one target having an opposing face that opposes the substrate supported by the substrate supporting part, a plurality of target holders each detachably holding the target so that the opposing face of the target opposes the substrate, a cooling unit that cools the plurality of target holders, and at least one cooling panel. The at least one cooling panel includes a held part that has a shape enabling the cooling panel to be detachably held by the target holder, and a heat receiving part having a heat receiving face that opposes the substrate in a state where the held part is held by the target holder and receives radiation heat emitted from the substrate. The held part transfers heat from the heat receiving face to the target holder. Each of the plurality of target holders selectively holds the target or the held part of the cooling panel.

DESCRIPTION OF EMBODIMENTS

A preferable embodiment of the present invention will now be described with reference to the drawings.

FIGS. 1 to 7 illustrate a film-forming apparatus 1 according to an embodiment of the present invention. The film-forming apparatus 1 includes a film forming chamber 2 containing a substrate W, a substrate supporting part 3 supporting the substrate W, at least one (two, in the embodiment) target 4, at least one (two, in the embodiment) cooling panel 7, a plurality of (four, in the embodiment) target holders 5 that can selectively and detachably hold the target 4 or the cooling panel 7, and a cooling unit 6 that cools a plurality of the target holders 5.

The film-forming apparatus 1 is an apparatus for forming a film with particles of a film-forming material emitted from the target 4 to the substrate W using a film-forming technique such as arc-ion plating. The target holder 5 is configured to selectively hold the target 4 or the cooling panel 7.

The film forming chamber 2 is a hollow box having therein a space 2a in which the substrate W can be contained. The film forming chamber 2 has a plurality of side walls 2b. The target holder 5 is attached to each of a pair of opposing side walls 2b among a plurality of the side walls 2b. In the embodiment, two target holders 5 are attached to each of the side walls 2b to be disposed along the up-and-down direction. The disposition of the target holder according to the present invention however is not limited to the above configuration. The number of the target holders 5 is suitably determined considering the dimensions of the film forming chamber 2 and the substrate W on which a film is formed.

Figure 1:
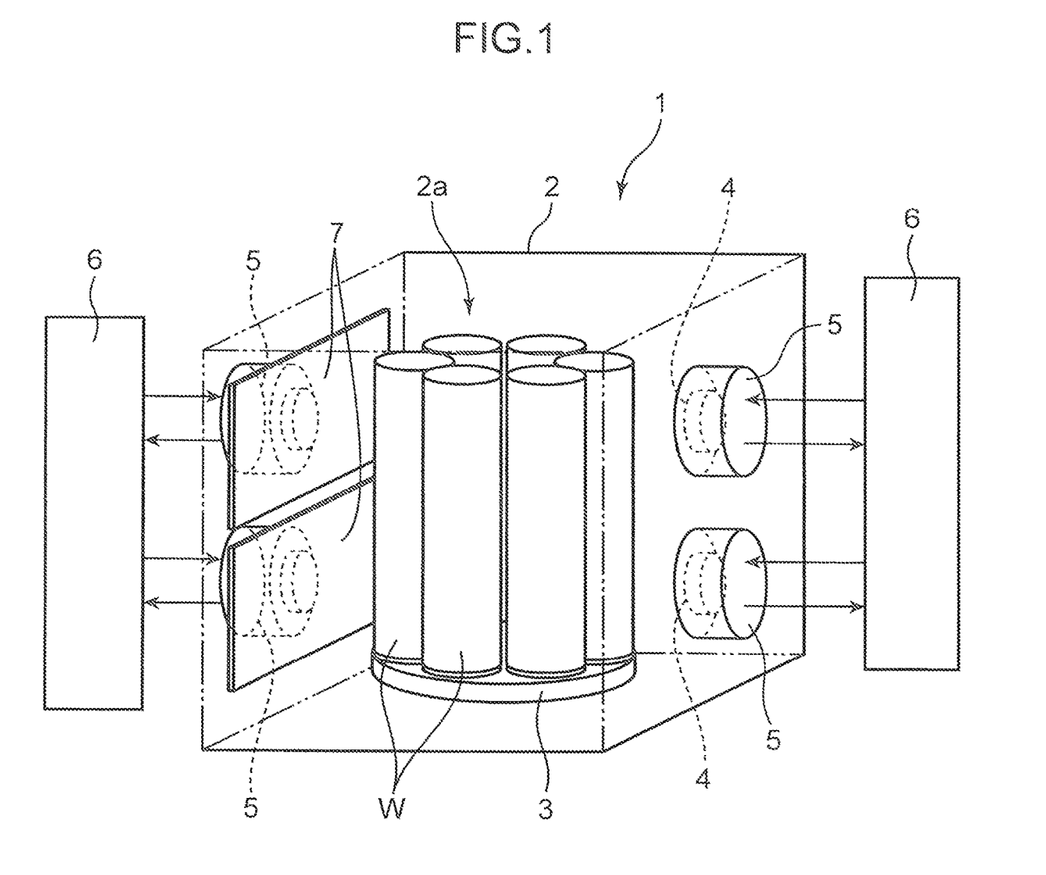
FIG. 1 is a perspective view schematically illustrating an overall configuration of a film-forming apparatus including a film-forming apparatus according to an embodiment of the present invention.
Figure 2:
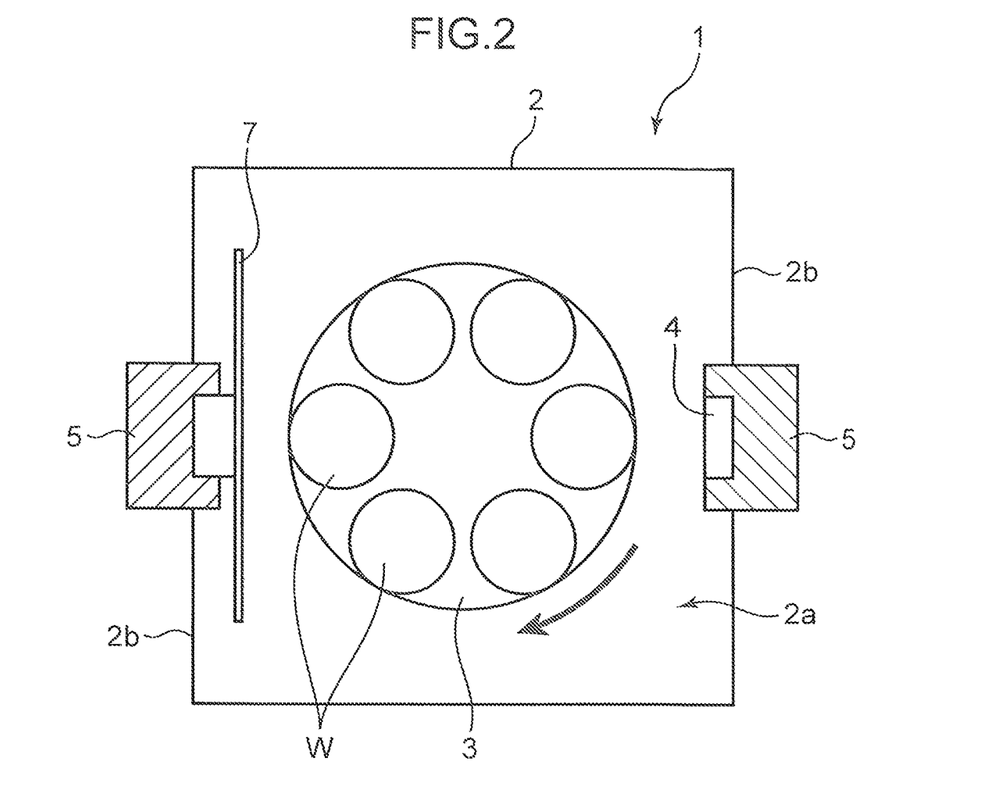
FIG. 2 is a sectional plan view of the film-forming apparatus illustrated in FIG. 1.
Figure 3:
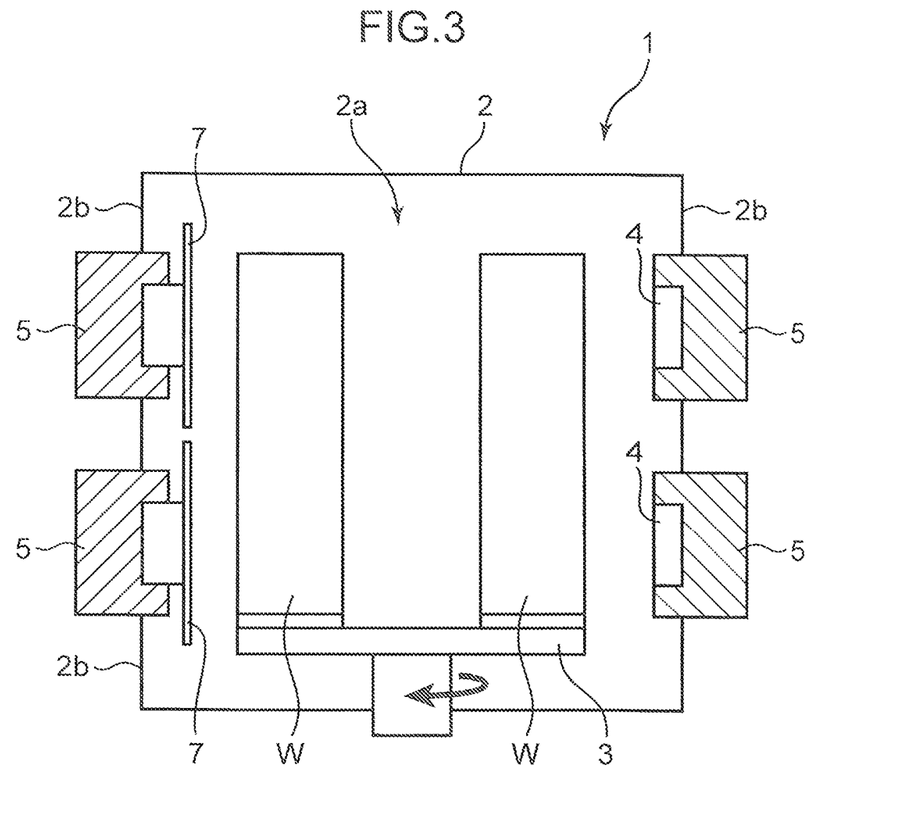
FIG. 3 is a sectional front view of the film-forming apparatus illustrated in FIG. 1.

The substrate supporting part 3 is configured to support the substrate W. For example, the substrate supporting part 3 illustrated in FIGS. 1 to 3 is a rotatable table rotatably mounted inside the film forming chamber 2 to support the substrate W in a manner allowing the substrate W to spin or revolve about a vertical axis.

The substrate W may have any shape and dimension which allow a film to be formed on a surface of the substrate W. For example, the substrate W may take a form of a bar, a plate, or other shapes. The material of the substrate W is not limited in particular in the invention. Any material that can form a film can be used, for example, a steel material or a resin material.

Each of the targets 4 includes a material of a film to be formed on the surface of the substrate W, for example, aluminum, titanium, or carbon. The material of the target 4 is not in particular limited in the present invention.

Figure 5:
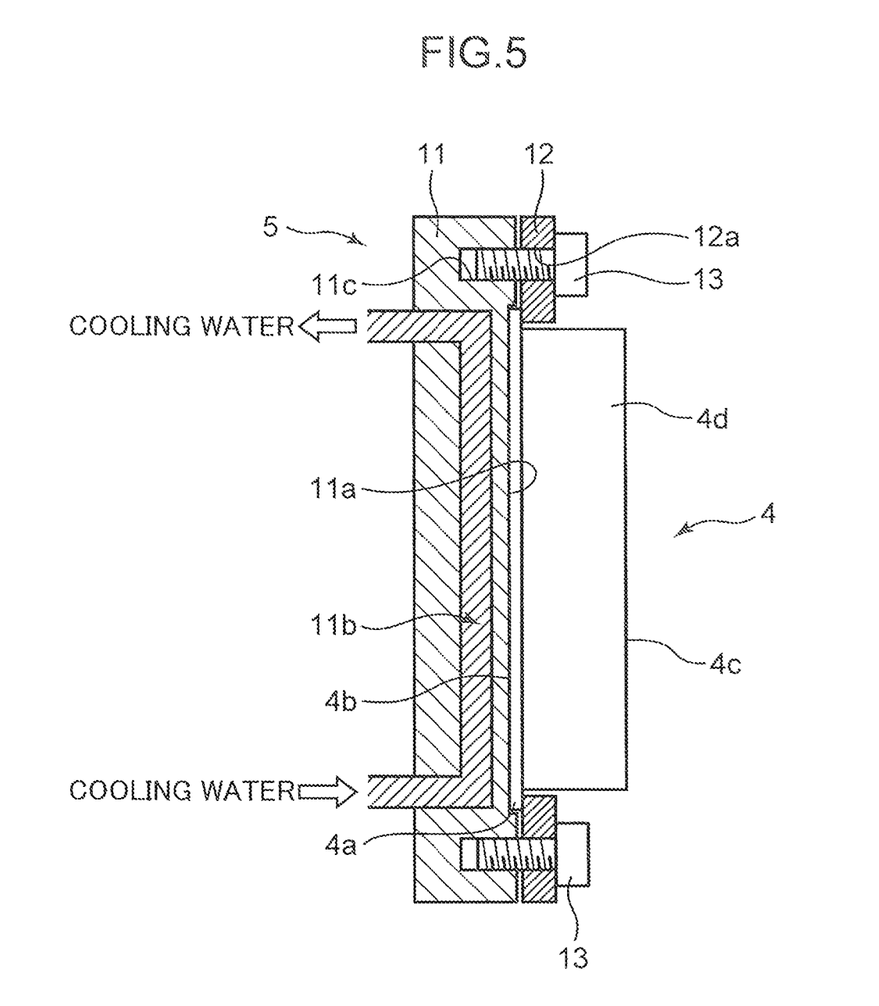
FIG. 5 is a sectional front view illustrating a target attached to the target holder illustrated in FIG. 1.

As illustrated in FIG. 5, each of the targets 4 according to the embodiment includes a target body 4d, and a held part 4b that is held by the target holder 5. The target body 4d has a form of a cylinder as illustrated in FIG. 1. One of faces on both ends, regarding the axial direction, of the target body 4d serves as a substrate opposing face 4c opposing the substrate W with the held part 4b held by the target holder 5. The held part 4b has an annular protruding portion 4a that is provided on the outer circumferential face of the end portion, regarding the axial direction, of the target body 4d in the opposite side of the end portion facing the substrate opposing face 4c and protrudes in the direction along the substrate opposing face 4c namely, radially outward. The shape of the target according to the present invention is not limited. The target may have a shape different from a cylinder, such as a square plate.

Figure 4:
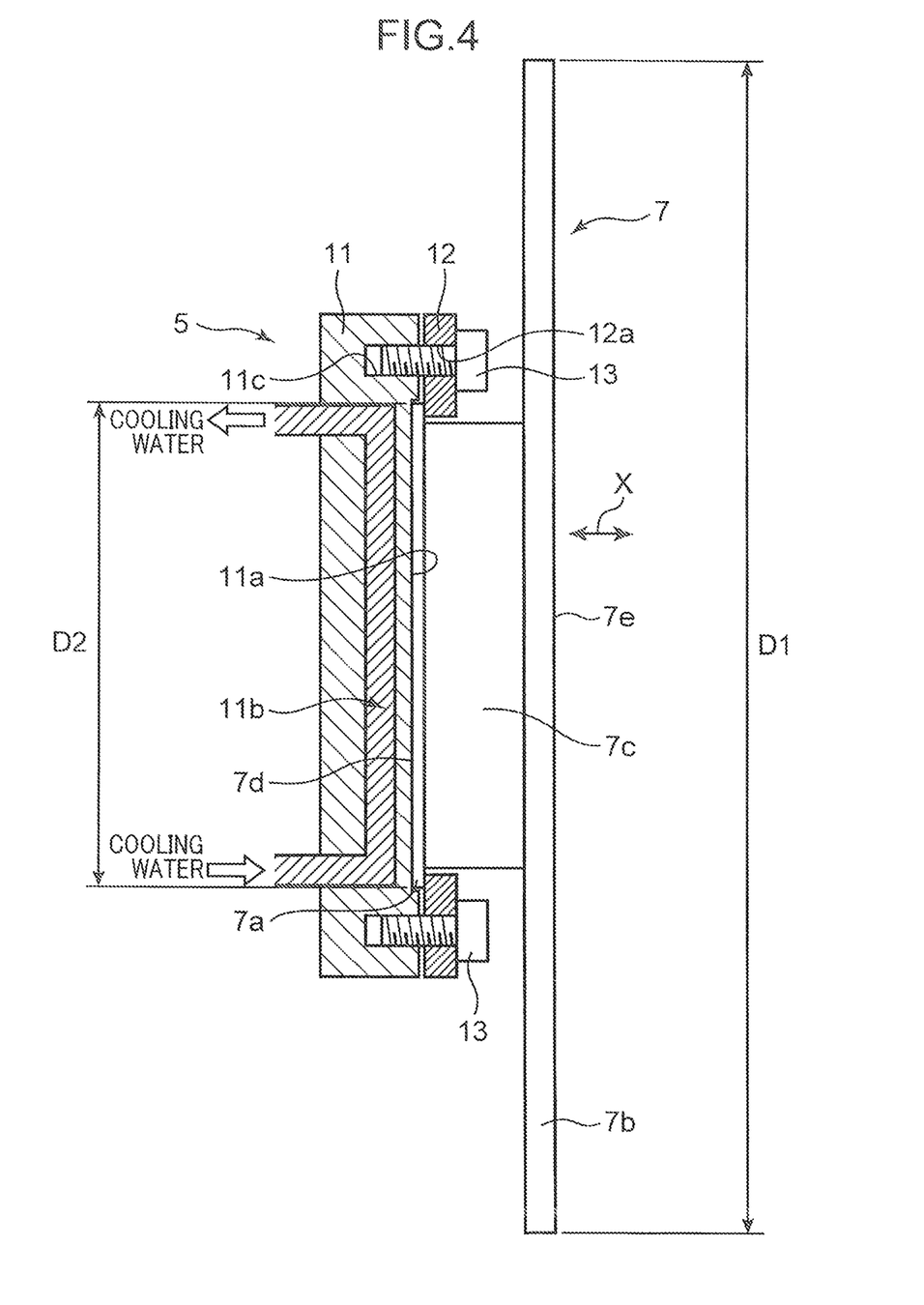
FIG. 4 is a sectional front view illustrating a cooling panel attached to a target holder illustrated in FIG. 1.

As illustrated in FIG. 4, each of the cooling panels 7 includes a held part 7d held by the target holder 5, a heat receiving part 7b having a heat receiving face 7e that receives radiation heat from the substrate W, and a connecting part 7c that interconnects the held part 7d and the heat receiving part 7b. The cooling panel 7 is made of a material having high thermal conductivity such as aluminum and copper.

Like the held part 4b of the target 4 (see FIG. 5), the held part 7d has a shape detachable to the target holder 5. Specifically, the held part 7d has a protruding portion 7a that protrudes outward in a direction different from the normal direction X normal to the heat receiving face 7e (in the embodiment, the direction along the heat receiving face 7e, that is, the radial direction of the connecting part 7c) further than the outer circumferential face of the connecting part 7c. The protruding portion 7a has an annular shape when viewed along the normal direction X.

The held part 7d is held by the target holder 5 so that the heat receiving face 7e of the heat receiving part 7b opposes the substrate W. In other words, the heat receiving face 7e opposes the substrate W to receive the radiation heat emitted from the substrate W in a state where the held part 7d is held by the target holder 5. The heat receiving face 7e according to the embodiment is a flat face. Alternatively, the heat receiving face 7e may have a shape other than a flat face, for example, a face curved so that the normal direction X normal to the heat receiving face 7e points the substrate W.

The connecting part 7c interconnects the heat receiving part 7b having the heat receiving face 7b and the held part 7d to allow heat transfer from the heat receiving face 7e to the target holder 5 via the connecting part 7c and the held part 7d.

The target holder 5 is configured to selectively and detachably hold the target 4 or the cooling panel 7. Specifically, the target holder 5 includes a backing plate 11 which is a main body, and a securing part as illustrated in FIGS. 4 and 5. The securing part selectively secures the target 4 or the cooling panel 7 to the backing plate 11.

The backing plate 11 includes a contact face 11a, a coolant path 11b, and a plurality of threaded holes 11c. The contact face 11a opposes the substrate W and can contact the held part 4b of the target 4 or the held part 7d of the cooling plate 7. The coolant path 11b is provided inside the backing plate 11 and allows a coolant such as cooling water to flow in the coolant path 11b. A plurality of the threaded holes 11c is provided in the circumference of the contact face 11a and is opened toward the substrate W. The backing plate 11 is made of a material having high thermal conductivity such as copper.

The securing part includes a pushing member 12 having a plurality of screw holes 12a, and a plurality of screws 13. A plurality of the screws 13 is inserted in a plurality of the screw holes 12a of the pushing member 12 to penetrate the pushing member 12 and is screwed into a plurality of the threaded holes 11c of the backing plate 11. The pushing member 12 is thereby secured to the rim of the backing plate 11.

The pushing member 12 is formed of, for example, a plurality of arc-shaped members (for example, a pair of half arc members made by dividing a ring into halves). The pushing member 12 may be a single, continuous annular member.

As illustrated in FIG. 5, the pushing member 12 has an inner diameter larger than the outer diameter of the target body 4d of the target 4 and smaller than the outer diameter of the annular protruding portion 4a.

The target 4 is attached to the target holder 5 as described below. As illustrated in FIG. 5, the target body 4d of the target 4 is placed in the inner side of the pushing member 12 with the held part 4b of the target 4 behind the pushing member 12, that is, in a place further remote from the substrate W than the pushing member 12 (in the left side in FIG. 5), and the pushing member 12 is secured to the backing plate 11 by a plurality of screws 13 to be positioned on the circumference of the contact face 11a of the backing plate 11. The pushing member 12 engages with the protruding portion 4a of the target 4 illustrated in FIG. 5 and pushes the held part 4b of the target 4 onto the contact face 11a of the backing plate 11, thereby securing the held part 4b to the contact face 11a. Similarly, the cooling panel 7 can be attached to the target holder 5. That is, as illustrated in FIG. 4, the connecting part 7c of the cooling panel 7 is placed in the inner side of the pushing member 12 with the held part 7d of the cooling panel 7 behind the pushing member 12, and the pushing member 12 is secured to the backing plate 11 by a plurality of screws 13 to be positioned on the circumference of the contact face 11a of the backing plate 11. The pushing member 12 engages with the protruding portion 7a of the cooling panel 7 and pushes and secures the held part 7d of the cooling panel 7 onto the contact face 11a of the backing plate 11.

In a view along the normal direction X, the area of the heat receiving face 7e is larger than the area of a substrate opposing portion of the target holder 5, that is, a portion that opposes the substrate W when there is no cooling panel 7. The substrate opposing portion of the embodiment is the contact face 11a of the backing plate 11 constituting the target holder 5. For example, a dimension D1 along the up-and-down direction of the heat receiving face 7e is set to be sufficiently larger (for example, twice or larger) than a width D2 in the up-and-down direction of the contact face 11a.

The cooling unit 6 is configured to continuously supply a coolant, such as cooling water, for cooling the target holder 5 to the target holder 5. For example, the cooling unit 6 communicates with the upstream end and the downstream end of the coolant path 11b inside the backing plate 11 and continuously supplies the coolant, such as cooling water, to the coolant path 11b to cool the target holder 5.

The film-forming apparatus 1 can form a film on the surface of the substrate W by, for example, a procedure described below to produce a film-formed product.

First, the film-forming apparatus 1 is prepared (preparation step).

Then, to which target holder 5 among a plurality of the target holders 5 the target 4 is attached and to which target holder 5 the cooling panel 7 is attached are determined. That is, a first target holder that holds the target 4 and a second target holder that holds the cooling panel 7 are selected from a plurality of the target holders 5 (selection step).

In the selection step, at least one target holder 5, among a plurality of the target holders 5, is selected as the target holder. Among the rest of the target holders 5, any number of the target holder 5 can be selected as the target holder for holding the cooling panel 7. That is, if the number of the target holder 5 is N, the number of the cooling panel 7 can be set within a range from 0 to N−1.

In the selection step, the number of the target 4 and the number of the cooling panel 7 are determined considering the balance between the cooling of the substrate W and the efficiency of forming a film on the substrate W. Specifically, if priority is given to the cooling of the substrate W, the number of the target 4 is kept low and the number of the cooling panel 7 is increased. If priority is given to the efficiency of forming a film on the substrate W, the number of the cooling panel 7 is kept low and the number of the target 4 is increased. For example, if priority is given to the cooling of the substrate W in the film-forming apparatus 1 including four target holders 5 as illustrated in FIGS. 1 to 3, the two target holders 5 secured to one of a pair of opposing side walls 2b of the film forming chamber 2 are each selected as the first target holder for holding the target 4 and the two target holders 5 secured to the other side wall 2b are each selected as the second target holder for holding the cooling panel 7.

In the selection step, the target 4 is attached to (namely, held by) the target holder 5 selected from a plurality of the target holders 5 as the first target holder, and the cooling panel 7 is attached to (namely, held by) the target holder 5 selected as the second target holder. A film forming step described below is then performed.

The inside of the film forming chamber 2 is depressurized to a near vacuum and a voltage is applied to the target holder 5 holding the target 4. Particles of the film-forming material are discharged from the opposing face 4c of the target 4 and a film is formed on the surface of the substrate W. In this process, the target holder 5 is cooled by the cooling water supplied from the cooling unit 6 to a suitable temperature, for example, 25° C. The target 4 is thereby cooled via the target holder 5 to about 50 to 60° C. This prevents melting of the target 4.

While a film is formed using the target 4, no voltage is applied to the target holder 5 holding the cooling panel 7. While being cooled via the target holder 5 by the cooling water supplied by the cooling unit 6, the cooling panel 7 absorbs radiation heat emitted from the substrate W and the substrate W is thereby cooled. This cooling suppresses the rise in the temperature of the substrate W and thereby suppresses troubles such as decrease in hardness of a film made of, for example, carbon formed on the surface of the substrate W. Moreover, reduction in hardness of the substrate W or strain in the substrate W caused by the rise in the temperature of the substrate W can be suppressed by suppressing the rise in the temperature of the substrate W.

Figure 6:
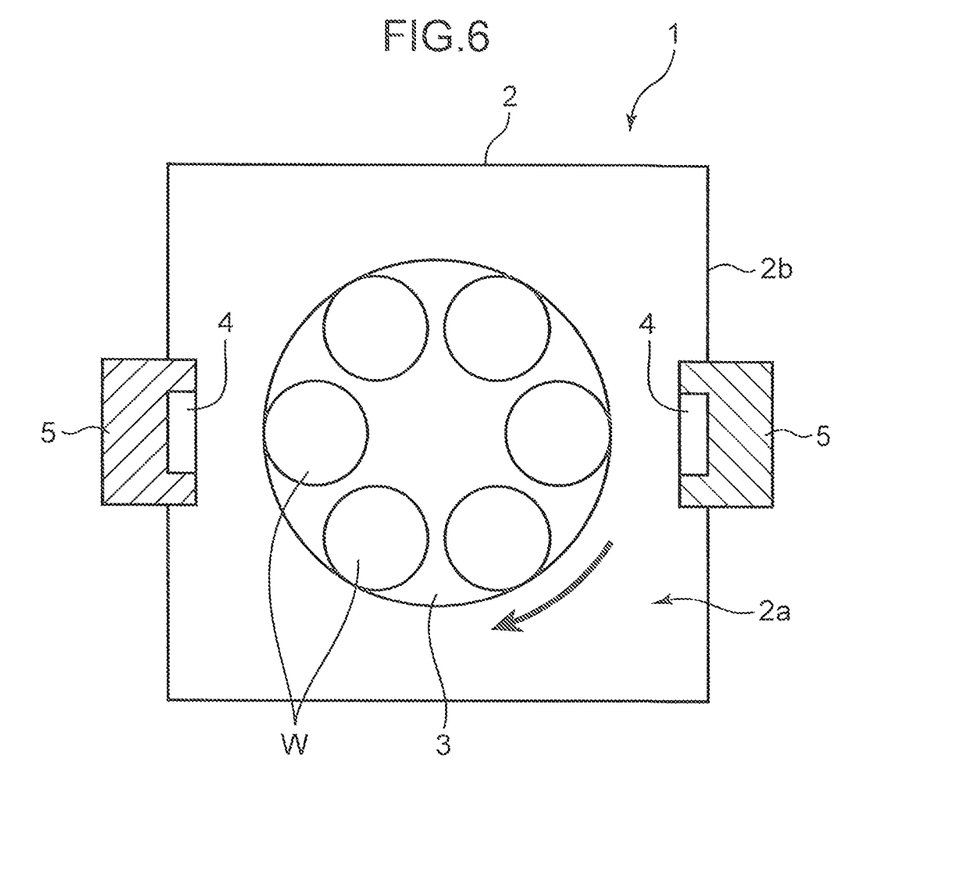
FIG. 6 is a sectional plan view illustrating the targets attached to all the target holders of the film-forming apparatus illustrated in FIG. 1.
Figure 7:
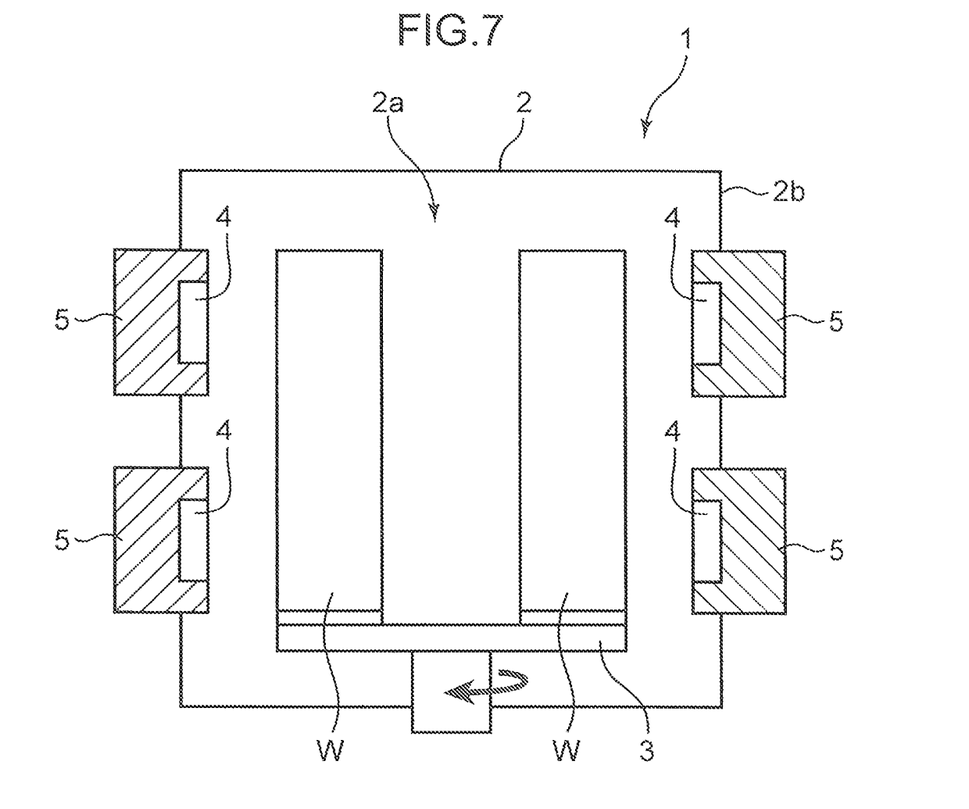
FIG. 7 is a sectional front view illustrating the targets attached to all the target holders of the film-forming apparatus illustrated in FIG. 1.

A certain type of film-forming material may have no trouble such as reduction in hardness of a film without cooling the substrate W during a film-forming process. In such a case, as illustrated in FIGS. 6 and 7, the film-forming process can be performed with all the target holders 5 each holding the target 4. Using many targets 4 at a same time can shorten the time of forming a film.

The film-forming apparatus 1 of the embodiment configured as described above uses the function of the cooling unit 6 cooling the target holder 5 to cool not only the target 4 but also the substrate W via the cooling panel 7. This simplifies the structure of the film-forming apparatus and enables downsizing of the film-forming apparatus.

Specifically, each target holder 5 that selectively holds the target 4 or the cooling panel 7 is cooled by the cooling unit 6, so that the target 4 held by the target holder 5 selected as the first target holder is cooled via the target holder 5. Meanwhile, the heat receiving face 7e of the cooling panel 7 held by the target holder 5 selected as the second target holder opposes the substrate W and receives the radiation heat emitted from the substrate W. The radiation heat received by the cooling panel 7 is transmitted to the target holder 5 cooled by the cooling unit 6. As a result, the cooling unit 6 that cools the target holder 5 holding the cooling panel 7 can cool the substrate W via the cooling panel 7. Thus, no cooling means dedicated for cooling the substrate W needs to be provided besides the cooling means for cooling the target 4. This simplifies the structure of the film-forming apparatus 1 and thus, the film-forming apparatus 1 can be downsized.

The cooling panel 7 detachably attached to the target holder 5 can have a simple structure not including a cooling mechanism such as a pipe for circulating the cooling water, so that the cooling panel 7 that can quite easily be attached and detached can be provided in a large range inside the film forming chamber 2.

Since each of the target holders 5 is cooled by the cooling unit 6, the target holder 5 that has no target 4 nor the cooling panel 7 attached thereto, namely holding nothing, can absorb the radiation heat from the substrate W. To do so however is not preferable because particles of the film-forming material tend to deposit on the backing plate 11 (in particular, the contact face 11a of the plate 11) which is the main body of the target holder 5 holding nothing. Replacement and maintenance of the backing plate 11 firmly fixed by welding, for example, to the film forming chamber 2 are more difficult than those of the cooling panel 7. In contrast, the cooling panel 7 that is detachably attached to the target holder 5 like in the embodiment described above can easily be detached from the target holder 5 for replacement or maintenance (for example, cleaning off by shot blasting a film deposited during the film-forming processing).

The heat receiving face 7e of the cooling panel 7 of the film-forming apparatus 1 according to the embodiment has an area larger than the area, which opposes the substrate W, of the portion of the target holder 5 to efficiently absorb the radiation heat emitted from the substrate W. That is, the heat receiving face 7e receives a large amount of heat from the substrate W and thus has a large cooling effect on the substrate W. The cooling panel 7 including the heat receiving face 7e having a large area can reduce depositing of the particles of the film-forming material on the target holder 5 during the film-forming process.

In the embodiment, the configuration including the cooling unit 6 that continuously supplies a coolant, such as cooling water, for cooling the target holder 5 to the target holder 5, and the coolant path 11b that is formed inside the target holder 5 and allows the coolant to flow therein enables the target holder 5 and the cooling panel 7 held by the target holder 5 to be kept cooled during the film-forming process since the coolant, such as cooling water, continuously supplied to the target holder 5 from the cooling unit 6 flows in the coolant path 11b inside the target holder 5. The cooling panel 7 is cooled by making contact with the target holder 5 cooled by the coolant, so the coolant needs not be supplied to the cooling panel 7. Thus, the cooling panel 7 can have a structure that is easily detachable to the target holder 5.

Moreover, the film-forming apparatus 1 of the embodiment is such that the held part 7d of the cooling panel 7 has the protruding portion 7a protruding in a direction different from the normal direction X normal to the heat receiving face 7e (protruding along the heat receiving face 7e in FIG. 4) while the target holder 5 includes the backing plate 11, which is the main body formed with the coolant path 11b, the pushing member 12, and the screws 13, where the pushing member 12 and the screws 13 serve as the securing part that engages with the protruding portion 7a and secures the held part 7d onto the backing plate 11 while pushing the held part 7d against the main body. Accordingly, the pushing member 12 can push and secure the held part 7d onto the backing plate 11 cooled by the coolant flowing in the coolant path 11b provided inside the backing plate 11. The radiation heat from the substrate W can thus be transferred efficiently from the heat receiving face 7e of the cooling panel 7 to the target holder 5.

The securing part according to the present invention is not limited to the pushing member 12 and the screws 13. For example, the securing part may be a combination of the protruding portion 7a of the cooling panel 7 and a groove provided in the backing plate 11, where the groove has a shape enabling the protruding portion 7a to engage with the protruding portion 7a of the cooling panel 7 by rotating or horizontally moving the cooling panel 7 relative to the backing plate 11.

In a method for producing a film-formed product of the embodiment using the film-forming apparatus 1, the numbers of the targets 4 and the cooling panels 7 attached to the target holder 5 can be changed to any number. Thus, using a single film-forming apparatus 1, not only a film forming step, in which the substrate W is cooled by the cooling panel 7 and at the same time a film is formed on the substrate W with a plurality of targets 4 and the cooling panels 7 provided at a predetermined ratio as illustrated in FIGS. 1 to 3, but also a film forming step, in which the cooling panel 7 is not used and only forming of a film is performed using a plurality of targets 4 as illustrated in FIGS. 6 to 7, can be performed. Accordingly, it is not necessary to prepare a plurality of types of film-forming apparatus having different numbers of the cooling panels (that is, required of different cooling performances).

As described above, a film-forming apparatus having a simple and downsized structure and provided with an easily detachable cooling panel is provided. The film-forming apparatus includes a film forming chamber, a substrate supporting part that supports the substrate inside the film forming chamber, at least one target having an opposing face that opposes the substrate supported by the substrate supporting part, a plurality of target holders each detachably holding the target so that the opposing face of the target opposes the substrate, a cooling unit that cools the plurality of target holders, and at least one cooling panel. The at least one cooling panel includes a held part that has a shape enabling the cooling panel to be detachably held by the target holder, and a heat receiving part having a heat receiving face that opposes the substrate in a state where the held part is held by the target holder and receives radiation heat emitted from the substrate. The held part transfers heat from the heat receiving face to the target holder. Each of the plurality of target holders selectively holds the target or the held part of the cooling panel.

The film-forming apparatus uses the function of the cooling unit of cooling the target holder to cool not only the target but also the substrate. This simplifies the structure of the film-forming apparatus and enable downsizing of the film-forming apparatus.

Specifically, each of a plurality of the target holders selectively holds the target or the cooling panel and is cooled by the cooling unit. Thus, when the target holder holds the target, the target is cooled by the cooling of the target holder itself, and when the target holder holds the held part of the cooling panel, the substrate is cooled via the cooling panel. That is, the target holder holds the held part of the cooling panel so that the heat receiving face of the cooling panel opposes the substrate to receive the radiation heat emitted from the substrate, thereby enabling the radiation heat that the cooling panel receives to be transferred to the target holder cooled by the cooling unit. This enables the cooling unit that cools the target holder to cool the substrate via the cooling panel. Since no cooling means dedicated for cooling the substrate needs to be provided besides the cooling means for cooling the target, the structure of the film-forming apparatus can be made simple and the film-forming apparatus can be downsized. Since the held part of the cooling panel is detachably held by the target holder, replacement and maintenance of the cooling panel are easier than those of the target holder.

Preferably, the heat receiving face has an area larger than the area of the substrate opposing portion of the target holder, where the substrate opposing portion is a portion opposing the substrate.

With the heat receiving face of the cooling panel having such a large area, the radiation heat emitted from the substrate can be absorbed efficiently and deposit of the particles of the film-forming material on the target holder during the film-forming process can be reduced.

It is preferable that the cooling unit is configured to continuously supply a coolant for cooling the target holder to the target holder, and the target holder is internally formed with a coolant path allowing the coolant supplied to the target holder to flow therein.

The coolant path allows the coolant continuously supplied to the target holder from the cooling unit to flow inside the target holder, and thereby the target holder and the cooling panel held by the target holder can stably be kept cooled during the film-forming process. Moreover, the cooling panel receiving the radiation heat from the substrate is cooled via the target holder cooled by the coolant, so that the coolant is not necessary to flow inside the cooling panel. Thus, the cooling panel can have a structure easily detachable to the target holder.

It is preferable that the held part of the cooling panel has a protruding portion protruding in a direction different from the normal direction normal to the heat receiving face, and the target holder has a main body formed with the coolant path and a securing part that engages with the protruding portion and secures the held part onto the main body while pushing the held part against the main body.

The target holder includes both the main body cooled by the coolant flowing in the coolant path and the securing part that engages with the protruding portion of the held part of the cooling panel and pushes and secures the held part onto the main body which is cooled as described above. In this manner, the radiation heat from the substrate received by the heat receiving face of the cooling panel can efficiently be transferred to the target holder.

A method for producing a film-formed product by forming a film on the surface of the substrate with the particles discharged from the target using the film-forming apparatus is provided. This method includes a preparation step of preparing the film-forming apparatus, a selection step of selecting at least one first target holder and at least one second target holder among a plurality of the target holders of the film-forming apparatus, making the first target holder hold a target and making the second target holder hold the cooling panel, and a film forming step of forming a film on the surface of the substrate with particles of the film-forming material discharged from the opposing face of the target held by the first target holder and absorbing radiation heat emitted from the substrate by the cooling panel held by the second target holder while the cooling panel is cooled by the cooling unit via the second target holder.

In the method for production, the balance between the efficiency of forming a film and the performance of cooling the substrate of the film-forming apparatus can be changed by changing the number of the first target holder and the number of the second target holder selected in the selection step. Accordingly, it is not necessary to prepare a plurality of types of film-forming apparatuses using different numbers of the targets and the cooling panels, that is, having different levels of the balance described above.

The cooling panel is provided and each target holder of a plurality of target holders selectively holds a target or the cooling panel. The film-forming apparatus includes a film forming chamber, a substrate supporting part that supports the substrate inside the film forming chamber, one or a plurality of the targets each having an opposing face that opposes the substrate, the plurality of target holders each detachably holding the target, and a cooling unit that cools a plurality of the target holders. The cooling panel includes a held part that has a shape enabling the cooling panel to be detachably held by the target holder, and a heat receiving part having a heat receiving face that opposes the substrate in a state where the held part is held by the target holder and receives radiation heat emitted from the substrate. The held part is configured to be held by the target holder so as to transfer the radiation heat received by the heat receiving face to the target holder holding the held part.

The held part of the cooling panel enables the target holder of the film-forming apparatus including a plurality of the target holders and the cooling unit that cools the target holders to selectively hold the target or the cooling panel. Furthermore, in a state where the held part is held by the target holder, the heat receiving face of the cooling panel can oppose the substrate to receive the radiation heat emitted from the substrate and the radiation heat is transferred to the target holder cooled by the cooling unit, thereby cooling the substrate by the cooling unit via the cooling panel. This eliminates the need of providing the film-forming apparatus with a dedicated cooling means for cooling the substrate besides the cooling means for cooling the target, and thus the film-forming apparatus can be made simple and downsized.

The invention claimed is:

1. A film-forming apparatus comprising:
a film forming chamber;
a substrate supporting part that supports a substrate inside the film forming chamber;
at least one target having an opposing face that opposes the substrate held by the substrate supporting part;
a plurality of target holders each configured to detachably hold the target so that the opposing face of the target opposes the substrate;
a cooling unit that cools the plurality of target holders; and
at least one cooling panel,
wherein
the at least one cooling panel includes a held part having a shape enabling the held part to be detachably held by the target holder, and a heat receiving part having a heat receiving face that opposes the substrate in a state where the held part is held by the target holder and receives radiation heat emitted from the substrate, and
the held part transfers heat from the heat receiving face to the target holder and each of the plurality of target holders selectively holds the target or the held part of the cooling panel.

2. The film-forming apparatus according to claim 1, wherein
the heat receiving face has an area larger than an area of a substrate opposing portion of the target holder, the substrate opposing portion opposing the substrate.

3. The film-forming apparatus according to claim 1, wherein
the cooling unit is configured to continuously supply a coolant to the target holder to cool the target holder, and
the target holder is internally formed with a coolant path allowing the coolant supplied to the target holder to flow therein.

4. The film-forming apparatus according to claim 3, wherein
the held part of the cooling panel has a protruding portion protruding in a direction different from a normal direction normal to the heat receiving face, and the target holder has a main body formed with the coolant path and a securing part that engages with the protruding portion to secure the held part onto the main body while pushing the held part against the main body.

5. A method for producing a film-formed product by forming a film on a surface of a substrate with particles discharged from a target, the method comprising:
a preparation step of preparing the film-forming apparatus according to claim 1;
a selection step of selecting at least one first target holder and at least one second target holder among the plurality of target holders of the film-forming apparatus, making the first target holder hold a target and making the second target holder hold the cooling panel; and a film forming step of forming a film on the surface of the substrate with particles of a film-forming material discharged from the opposing face of the target held by the first target holder and absorbing radiation heat emitted from the substrate by the cooling panel held by the second target holder while the cooling panel is cooled by the cooling unit via the second target holder.

6. A cooling panel held by one target holder of a plurality of target holders of a film-forming apparatus including a film forming chamber, a substrate supporting part that supports a substrate inside the film forming chamber, at least one target having an opposing face that opposes the substrate, the plurality of target holders each configured to detachably hold the target, and a cooling unit that cools the plurality of target holders, the target holder selectively holding the target or the cooling panel, the cooling panel comprising:

a held part having a shape enabling the held part to be detachably held by the target holder; and a heat receiving part having a heat receiving face that opposes the substrate in a state where the held part is held by the target holder and receives radiation heat emitted from the substrate, wherein the held part is configured to be held by the target holder so that the radiation heat received by the heat receiving face is transferred to the target holder holding the held part.

7. A method for producing a film-formed product by forming a film on a surface of a substrate with particles discharged from a target, the method comprising:

a preparation step of preparing the film-forming apparatus according to claim 2;

a selection step of selecting at least one first target holder and at least one second target holder among the plurality of target holders of the film-forming apparatus, making the first target holder hold a target and making the second target holder hold the cooling panel; and a film forming step of forming a film on the surface of the substrate with particles of a film-forming material discharged from the opposing face of the target held by the first target holder and absorbing radiation heat emitted from the substrate by the cooling panel held by the second target holder while the cooling panel is cooled by the cooling unit via the second target holder.

8. A method for producing a film-formed product by forming a film on a surface of a substrate with particles discharged from a target, the method comprising:

a preparation step of preparing the film-forming apparatus according to claim 3;

a selection step of selecting at least one first target holder and at least one second target holder among the plurality of target holders of the film-forming apparatus, making the first target holder hold a target and making the second target holder hold the cooling panel; and a film forming step of forming a film on the surface of the substrate with particles of a film-forming material discharged from the opposing face of the target held by the first target holder and absorbing radiation heat emitted from the substrate by the cooling panel held by the second target holder while the cooling panel is cooled by the cooling unit via the second target holder.

9. A method for producing a film-formed product by forming a film on a surface of a substrate with particles discharged from a target, the method comprising:

a preparation step of preparing the film-forming apparatus according to claim 4;

a selection step of selecting at least one first target holder and at least one second target holder among the plurality of target holders of the film-forming apparatus, making the first target holder hold a target and making the second target holder hold the cooling panel; and a film forming step of forming a film on the surface of the substrate with particles of a film-forming material discharged from the opposing face of the target held by the first target holder and absorbing radiation heat emitted from the substrate by the cooling panel held by the second target holder while the cooling panel is cooled by the cooling unit via the second target holder.

* * * * *